US 6,590,819 B1

(54) DIGIT LINE EQUILIBRATION USING TIME-MULTIPLEXED ISOLATION

(75) Inventors: Aaron M. Baum, Meridian, ID (US); Karl L. Major, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/096,928

(22) Filed: Mar. 14, 2002

(51) Int. Cl.⁷ .................................................. G11C 7/00
(52) U.S. Cl. ........................ 365/203; 365/202; 365/205
(58) Field of Search ................................ 365/203, 202, 365/205, 149

(56) References Cited

U.S. PATENT DOCUMENTS

| | | |
|---|---|---|
| 6,166,976 A | 12/2000 | Ong |
| 6,269,037 B1 | 7/2001 | Porter |
| 6,333,882 B1 | 12/2001 | Merritt et al. |
| 6,434,065 B1 * | 8/2002 | Kobayashi et al. ......... 365/203 |
| 6,442,088 B1 * | 8/2002 | Tsuchida et al. ........... 365/203 |

OTHER PUBLICATIONS

*DRAM Circuit Design—A Tutorial*, Brent Keeth et al.; IEEE Press; pp 26 and 46–57.

* cited by examiner

Primary Examiner—Huan Hoang
(74) Attorney, Agent, or Firm—Dickstein Shapiro Morin & Oshinsky, LLP (57) ABSTRACT

The present invention provides a method and apparatus for equilibrating paired digit lines and sense amplifier input of a memory device, particularly useful where one side of a memory array contains a defect. A pair of isolation circuits is arranged on either side of a sense amplifier between the sense amplifier and respective digit lines pairs from two memory arrays. By selectively enabling one and then the other of the isolation circuits in a multiplexed fashion, the single equilibrate circuit located between one of the isolation circuits of the sense amplifier can separately and sequentially equilibrate both pairs of digit lines. In addition, both isolation circuits can be disabled isolating the sense amplifier from all digit lines allowing the sense amplifier to be separately equilibrated.

22 Claims, 4 Drawing Sheets

DIGIT LINE EQUILIBRATION USING TIME-MULTIPLEXED ISOLATION

FIELD OF THE INVENTION

This invention relates to a method of equilibrating digit sense lines of a random access memory.

BACKGROUND OF THE INVENTION

Computers and other electronic applications digitally store information. Broken down into basic building blocks of logic states, the information is stored in memory as either a "one" or a "zero." DRAM (Dynamic Random Access Memory) is the predominate storage medium currently utilized. Information is stored as an electrical charge as one of these respective logic states in one of a multitude of storage cells; in this system the cell in its simplistic form is a capacitor accessed through a transistor. These storage cells are laid out in multitude of arrays in rows and columns and each is located at the intersection of a row line and a column line, which are used to access the cell. Cells along a common digit line do not share a word line, and cells along a common word line do not share a digit line.

Reading the contents of a memory cell requires not only accessing the cell through the row and column lines and associated access transistors but also determining whether the stored charge represents a one or zero. To determine the logic state of the cell, the stored charge is compared to a reference charge in a sense amplifier. If the stored charge is greater than the reference charge then the it represents a one, if it less than the reference charge it represents a zero.

Prior to accessing any memory cell, digit lines which are connectable to the sense amplifier are equilibrated to common potential. Generally, random access memory devices include equilibration circuits for this purpose. The equilibration circuit typically comprises one or more transistors that are connected between paired digit lines of two separate sub-arrays on either side of the sense amplifier. These transistors are enabled prior to accessing the memory cell to provide a common voltage on the digit lines and to short the paired digit lines together to average the charges in the two lines. A typical equilibrate voltage is Vcc/2. Typically, it is also desirable to equilibrate, or pre-charge, the sense amplifier input. The memory cell is then accessed and its charged sensed by the sense amplifier. Typically, a sense amplifier will comprise a pair of latches, each having cross coupled transistors, one uses an NMOS transistor pair and is termed the N sense amplifier, while the other latch uses a PMOS transistor pair and is termed the P sense amplifier.

Figure 1:
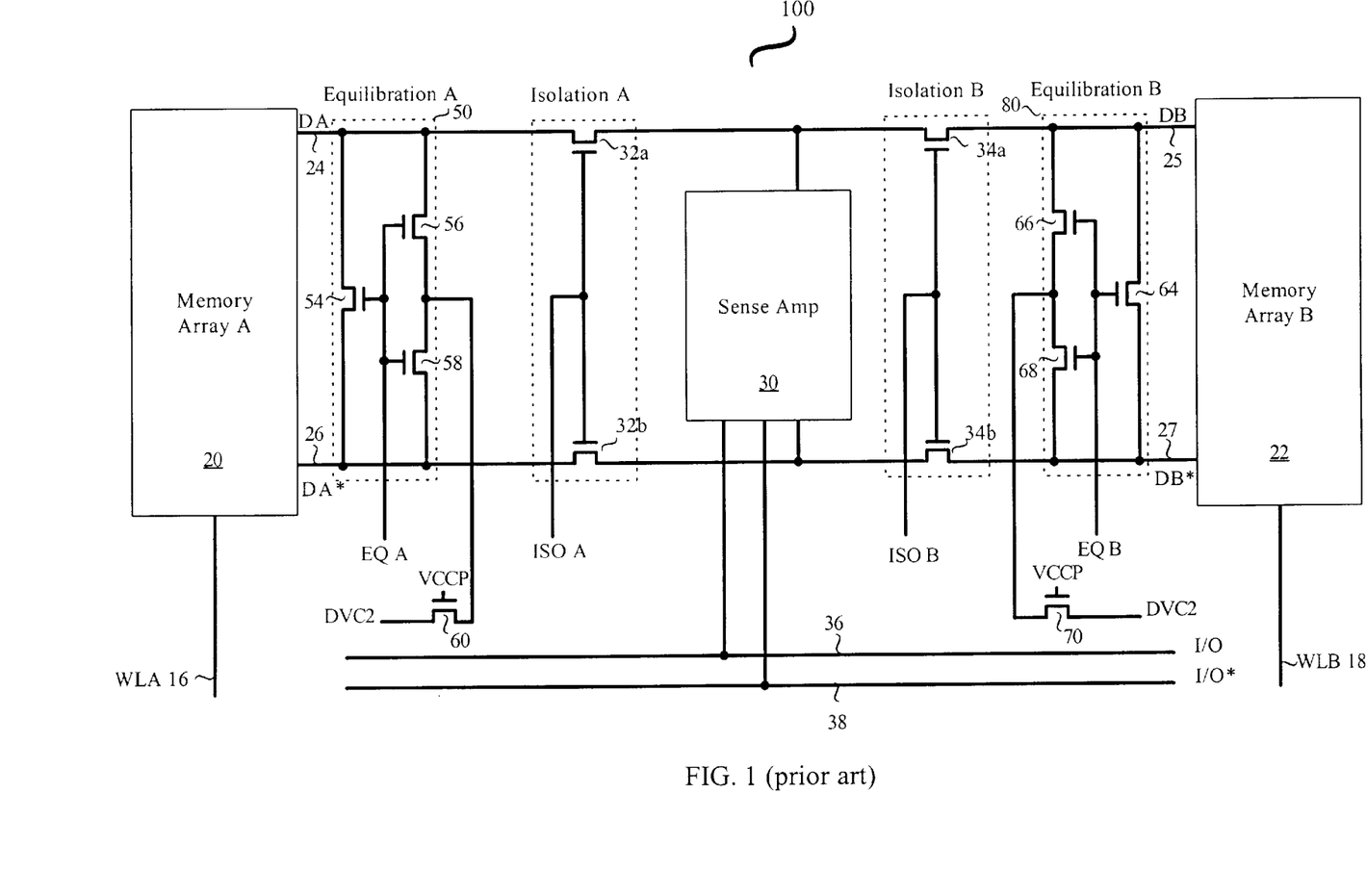
FIG. 1 is a schematic diagram of a prior art equilibration circuit.

FIG. 1 illustrates a conventional sense amplifier 30 containing the N and P sense amplifier and related equilibration circuitry. The sense amplifier senses a first memory array ARRAY A 20 and a second memory array ARRAY B 22, each of which contains a plurality of memory cells. Sense amplifier 30 senses the voltage level in a selected memory cell of the selected ARRAY A 20 or B 22, via the pair of complimentary digit lines DA 24 and DA* 26 or DB 25 and DB* 27, respectively. One of the arrays A 20, B 22 is selected by the application of signals to a word line 16 or 18 corresponding to a memory cell in memory ARRAY A 20 or memory ARRAY B 22, respectively and to ISOA and ISOB to transistors 32a, 32b and 34a, 34b, respectively. Thus, when ISOA is enabled and driven to a logic high value, transistors 32a and 32b become conductive, i.e., turn on, to connect ARRAY A 20 to sense amplifier 30. When ISOB is enabled and driven to a logic high value, transistors 34a and 34b turn on to connect ARRAY B 22 to sense amplifier 30.

Equilibration circuits 50 and 80 are provided to pre-charge the digit lines. For simplicity the operation of equilibrated circuit 50 for the memory ARRAY A 20 side of the sense amplifier 30 is now described, it being understood that equilibration circuit 80 operates the same way for the memory ARRAY B 22 side of the sense amplifier 30.

Equilibration circuit 50 includes transistor 54 with a first source/drain region coupled to digit line DA 24, a second source/drain region coupled to digit line DA* 26 and a gate coupled to receive an equilibration signal labeled EQA. Equilibration circuit 50 further includes transistors 56, 58 and 60. Transistor 56 includes a first source/drain region that is coupled to digit line DA 24, a gate that is coupled to receive the equilibration signal EQA, and a second source/drain region that is coupled to a first source/drain region of transistor 60. Transistor 58 includes a first source/drain region that is coupled to digit line DA* 26, a gate that is coupled to receive the equilibration signal EQA, and a second source/drain region that is coupled to the first source/drain region of transistor 60. Transistor 60 has a second source/drain region that is coupled to an equilibration voltage DVC2, typically Vcc/2, and a gate that is connected to a pumped Vcc voltage, VCCP, which is typically about one to two volts higher than Vcc. The application of VCCP to the gate of transistor 60 causes transistor 60 to supply equilibrated voltage to transistor 56, 58. When the EQA signal is at a high logic level, transistors 56, 58 apply the equilibrated voltage the digit line DA 24 and digit line DA* 26 and transistor 54 shorts the lines such that both lines are equilibrated to the voltage Vcc/2.

During a read operation, the digit line DA 24 will go to Vcc or GND depending on the stored charge in the read cell. Sense amplifier 30 senses the differential voltage across the digit lines DA 24 and DA* 26, which represents the charge stored in the accessed memory cell and drives the digit line (DA 24, DA* 26) containing the higher voltage to Vcc and the digit line (DA 24, DA* 26) containing the lower voltage to GND. These respective voltages, VCC and GND, are also provided to the I/O, I/O* lines 36, 38.

This equilibration configuration of FIG. 1 works well if there are no defects (i.e., shorted column or row lines) on any of the digit lines DA 24, DA* 26 or DB 25, DB* 27. If, however, there is a defect, such as a column to row short on a digit line on one side of sense amplifier 30, the digit lines and sense amplifier 30 will be equilibrated to a value much less than Vcc/2 (i.e., ground, in case of a hard short). This can significantly reduce or eliminate any zero's margin for the functional side digit lines. Thus, there are problems with the conventional equilibration circuits 50 and 80 as laid out in FIG. 1 and utilized as discussed, when a column to row fabrication short circuit occurs within a memory array. For example, when a short in memory array A 20, consisting of a short between digit line DA 24 and wordline WLA 16, does occur, a conductive path is created between ground and Vcc/2 through transistors 56 and 60. Typically, transistor 60 is sized to limit the amount of current that will pass through it when a short exists. For example, the current is typically limited to approximately 40 mA. As the densities of memory circuits increase, however, the number of such column to row shorts increases. Thus, the total current drawn from Vcc/2 to ground by multiple shorts may be sufficient to cause a significant decrease in the voltage Vcc/2. A decrease in the voltage Vcc/2 will adversely affect the operation of the sense amplifier 30, as the digit lines DA 24 and DA* 26 will not be properly pre-charged. Additionally, a column to row short increases the power consumption by the memory device, and also increases the accompanying heat dissipation, both of which can adversely affect the operation of the memory device and system in which it is installed. Furthermore, a short in ARRAY A 20 can effect the equilibration of ARRAY B 22 and sense amplifier 30 and visa versa.

There have been several methods proposed to prevent such a drop in the level of Vcc/2 caused by column to row shorts. For example, a global Vcc/2 supply line with a fuse, parallel to a column select line, has been proposed. Thus, if a column to row short circuit, exists in ARRAY A 20, a fuse could be blown, thus removing the supply voltage Vcc/2 from equalization circuits 50a, 50b and preventing the short circuit from causing a decrease in the voltage Vcc/2. There are problems with this approach, however, as the opening of a fuse disables all segments in a column and will disable every segment in that column, requiring an entire redundant column for repair, instead of just a column segment to replace the defective memory cell.

Thus, there exists a need for an equilibration circuit in a memory device that limits and isolates excessive current from being drawn during equilibration so that under short conditions the sense amplifier can continue to properly read memory cells from digit lines on one side of the sense amplifier which are unaffected by shorts on the digit lines on the other side of the sense amplifier.

SUMMARY

The present invention provides a method and circuit arrangement for properly equilibrating paired digit lines and a sense amplifier input of a memory array even where a digit line on one side of the sense amplifier connected between two memory arrays contains a defect. The circuit utilizes a single equilibrating circuit, which is located between a first isolation circuit, which connects digit lines of a first array to a sense amplifier, and the sense amplifier on one array side of the sense amplifier. A second isolation circuit is provided between the sense amplifier and the digit lines of a second array provided on the other side of the sense amplifier. By selectively enabling the isolation circuits in accordance with a multiplexing arrangement, the single equilibrate circuit can separately equilibrate both pairs of digit lines and the sense amplifier. Consequently, a short or defect that may occur on a digit line on one side of the sense amplifier does not affect the equilibration of a digit line on the other side of the sense amplifier. Nor will a short or defect on either side of the sense amplifier affect the equilibration of the sense amplifier. These and other features and advantages of the invention will be more readily understood from the following detailed description of the invention, which is provided in connection with the accompanying drawings.

DETAILED DESCRIPTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The present invention will be described as set forth in the preferred embodiments illustrated in FIGS. 2 and 3. Other embodiments may be utilized and structural or logical changes may be made without departing from the spirit or scope of the present invention. Like items are referred to in the various drawings with like reference numerals.

In accordance with the present invention, a method of digit and sense amplifier equilibration is provided which isolates defects such as column to row line shorts on one side of the sense amplifier and permits the continued of use of the sense amplifier and the reading of a memory cell connected to a digit line on the other side of the sense amplifier which is not subject to row to column shorts.

Figure 2:
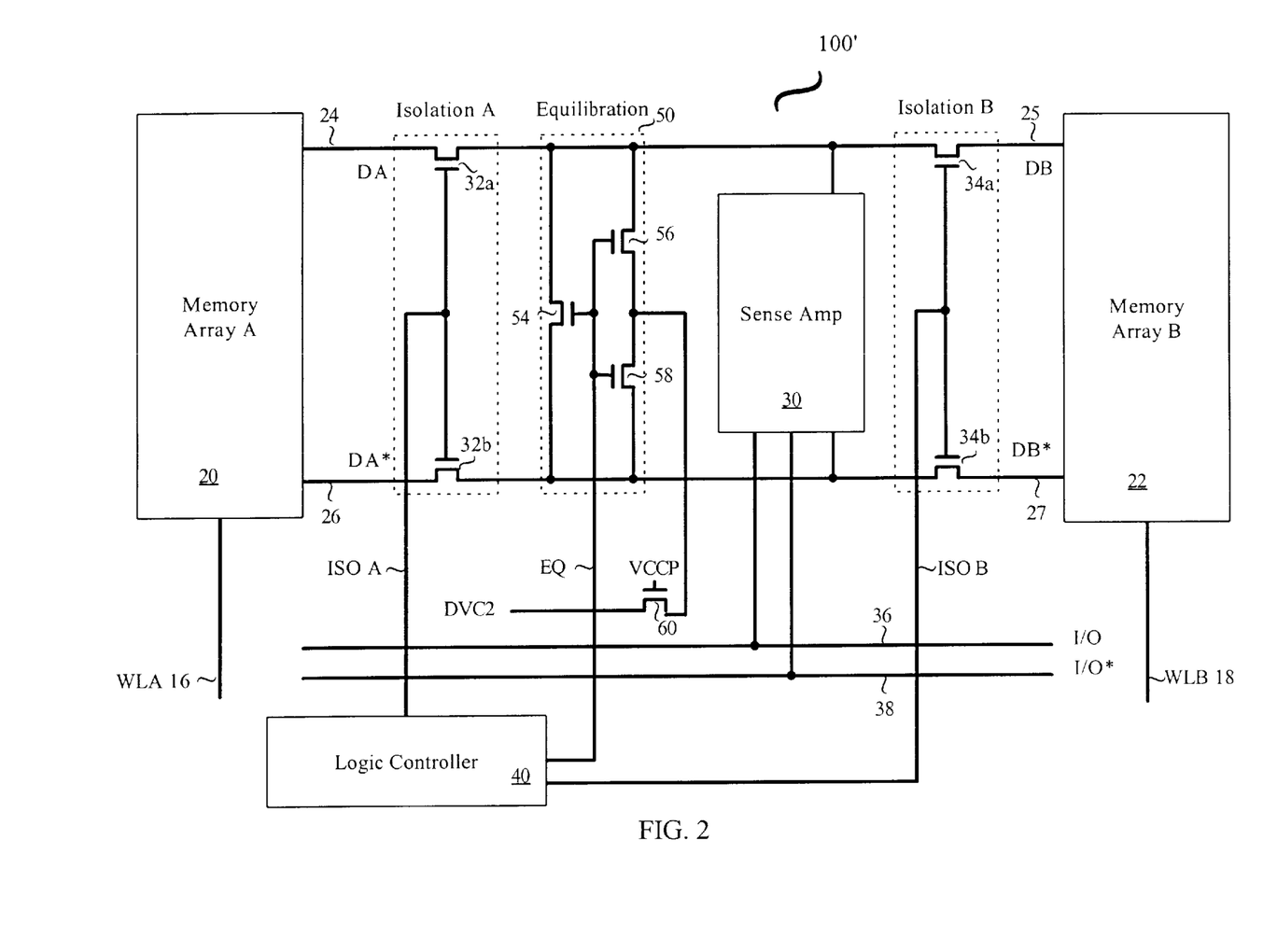
FIG. 2 is a schematic diagram of equilibration circuitry in accordance with the present invention.

FIG. 2 illustrates a sense amplifier 30 and related circuitry in accordance with an exemplary embodiment of the invention. A first memory array ARRAY A 20 and a second memory array ARRAY B 22 each contains a plurality of memory cells. A sense amplifier 30 senses the voltage level in the selected memory cell of the selected array A 20 or B 22 via the pair of digit lines DA 24, DA* 26 or DB 25, DB* 27. One of the arrays A 20 or B 22 is selected by the application of signals ISOA and ISOB to isolation transistors 32a, 32b and 34a, 34b, arranged as described with respect to FIG. 1.

Assuming ARRAY A 20 is being read, when sense amplifier 30 senses the differential voltage across the digit lines DA 24 and DA* 26, it drives one of the lines DA 24, DA* 26 having the higher voltage to Vcc and the other line having the lower voltage to GND. Since the output lines I/O 36, I/O* 38 are coupled to the lines DA 24, DA* 26 during a read operation, the output lines contain the sensed charge from a read memory cell.

In accordance with the present invention, a single equilibration circuit 50 is provided to equilibrate the digit lines DA 24 and DA* 26 and digit lines DB 25 and DB* 27 as well as the sense amplifier 30 input.

Equilibration circuit 50 is the same as that illustrated in FIG. 1; however, it is located between the isolation A circuit and sense amplifier 30. Sense amplifier 30 is coupled to memory ARRAY B 22 by the isolation B circuit. No equilibration circuit is provided on this side of the sense amplifier 30.

The method of operating the equilibration circuit 50 comprises three steps: first, isolate and equilibrate a first pair of digit lines and the sense amplifier; second, isolate and equilibrate a second pair of digit lines and the sense amplifier; and, third, isolate and equilibrate the sense amplifier. The method may be applied repeatedly until the memory array is accessed; therefore maintaining the circuitry in a ready state for reading and minimizing voltage loss resulting from potential leakage (i.e., sneak path loss). The method will be described with respect to the timing diagram illustrated in FIG. 3. Logic controller 40 implements the method of operating the equilibration circuit 50 and isolation circuits A and B by transmitting isolation ISOA and ISOB and equilibrate EQ control signals to the different circuits involved in the equilibration process in accordance with the timing pattern of FIG. 3.

If an access of a memory cell in ARRAY A 20 is to be performed, logic controller 40 issues an equilibrate control signal EQ (EQ goes high) and also issues a ISOA control signal (ISOA goes high). This causes equilibration circuit 50 to apply an equilibration voltage DVC2 (Vcc/2) to both digit lines DA 24 and DA*26 and also short digit line DA 24 to digit line DA* 26 such that both lines are equilibrated to the voltage DVC2. Next, logic controller 40 removes the ISOA control signal (ISOA goes low) while retaining the equilibration control signal EQ and also issues the ISOB control signal (ISOB goes high). As a result, the paired digit lines DB 25 and DB* 27 from memory ARRAY B 22 are equilibrated. Then, logic controller 40 removes the ISOB control signal (ISOB goes low) while retaining the control signal EQ and the sense amplifier 30 input is equilibrated. Although logic controller 40 is shown as a separate component in the embodiment displayed in FIG. 2, the functionality of logic controller 40 may be incorporated as part of the function of other device controllers within a memory device (i.e., a read/write control circuit).

Figure 3:
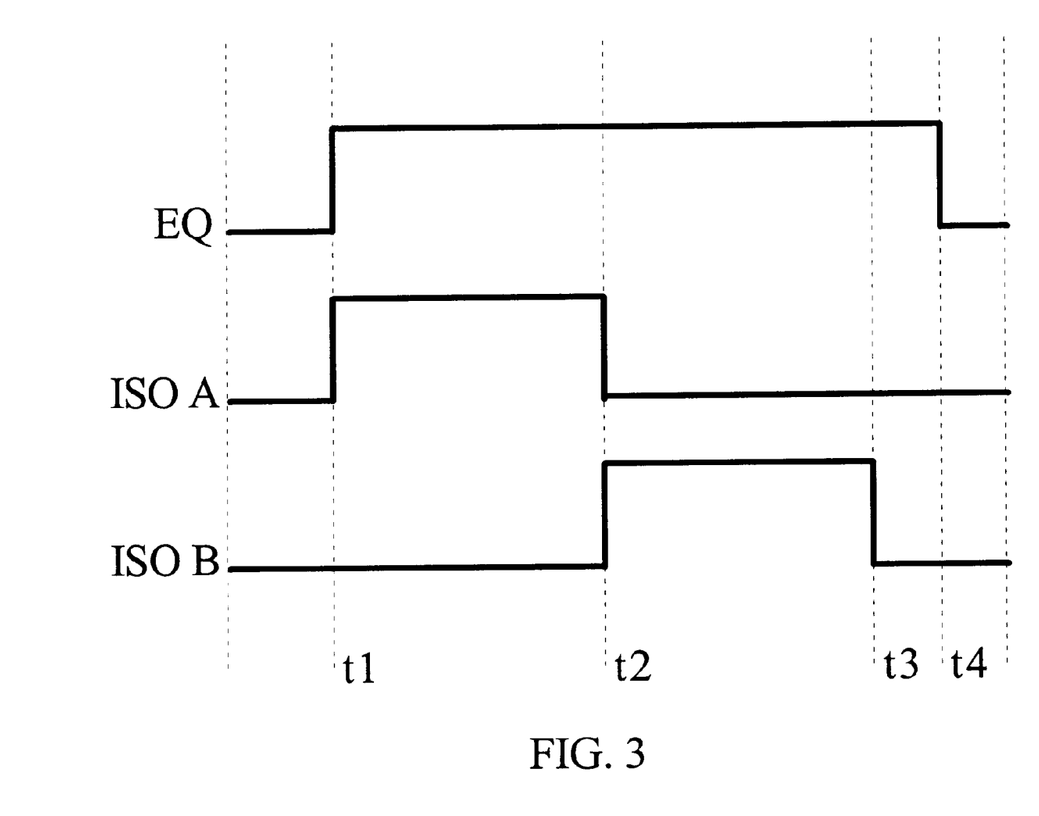
FIG. 3 is a representational timing diagram used in explaining operation of the present invention.

The timing operation of logic controller 40 is more clearly shown in FIG. 3. Thus, at time t1, a ISOA control signal is sent by logic controller 40 to transistors 32a and 32b, enabling them thereby connecting digit lines DA 24, DA* 26 of memory ARRAY A 20 to the sense amplifier 30. The equilibration signal EQ is also issued by logic controller 40 at t1, or shortly before, or shortly thereafter, causing equilibration of the lines DA 24, DA* 26 and the sense amplifier 30. Digit lines DA 24 and DA* 26 will thus be equilibrated, assuming no shorts exist.

At time t2, logic controller 40 ceases sending the ISOA control signal to the first isolation circuit; therefore transistors 32a and 32b are disabled. It is desirable that the delay between t1 and t2 is such that sufficient time is provided for the digit lines DA 24 and DA* 26 to reach steady state Vcc/2.

At time t2, the ISOB control signal is sent by logic controller 40 and transistors 34a and 34b are enabled. The equilibration control signal EQ is still present. This allows equilibration of digit lines DB 25 and DB* 27 and sense amplifier 30, again assuming no shorts or defects in memory ARRAY B 22 associated with digit lines DB 24 and DB* 27.

At time t3, the ISOB control signal is removed by logic controller 40 and transistors 34a and 34b are disabled. It is desirable that the delay between t2 and t3 is such that sufficient time is provided for the digit lines DB 25 and DB* 27 to reach steady state Vcc/2. Both ISOA and ISOB control signals are now disabled leaving the sense amplifier 30 isolated from the memory arrays A 20 and B 22. The equilibration signal EQ is still present. As the equilibration circuit is in between the isolation circuits ISOA and ISOB and remains enabled by the presence of the equilibration signal EQ, and connected to the sense amplifier 30, the sense amplifier 30 input is equilibrated.

At time t4, the equilibration circuit is disabled by logic controller 40 which removes the control signal EQ (EQ goes low). Accordingly, during the period from t1 through t4, the equilibrate circuit 50 first equilibrates the digit lines DA 24, DA* 26, then equilibrates the digit lines DB 25, DB* 27, and then equilibrates the sense amplifier 30 input in a multiplexed fashion.

Now, assume a column to row short circuit exists in a memory cell in the memory ARRAY A 20 associated with digit lines DA 24, DA* 26, the equilibration method described with reference to FIGS. 2 and 3 will first try to equilibrate the digit lines DA 24 and DA* 26. They are not equilibrated because of the short; however, digit lines DB 25 and DB* 27 will subsequently be properly equilibrated (assuming no shorts are present for digit lines DB 25 and DB* 27) because they are isolated from digit lines DA 24 and DA* 26. Next, the sense amplifier 30 input, which isolated from both pairs of digit lines, will be equilibrated and is then ready to properly read a memory cell from the memory ARRAY B 22.

Now, assume a column to row short circuit exists in a memory cell in the memory ARRAY B 22 associated with the digit lines DB 25 and DB* 27, the equilibration method described with reference to FIGS. 2 and 3 will first try to equilibrate the digit lines DA 24 and DA* 26. They are equilibrated (assuming no shorts are present for digit lines DA 24 and DA* 26). Next, the equilibration method will try to equilibrate the digit lines DB 25 and DB* 27, but will be unable to do so because of the short. Next the sense amplifier 30 input which is isolated from all digit lines will be equilibrated and is then ready to properly read a memory cell from the memory ARRAY A 20.

Thus, in accordance with the present invention, the equilibration method permits continued reading of memory cells on digit lines which are not defective without being affected by defects on digit lines on an opposite side of a sense amplifier which might otherwise affect equilibration.

Figure 4:
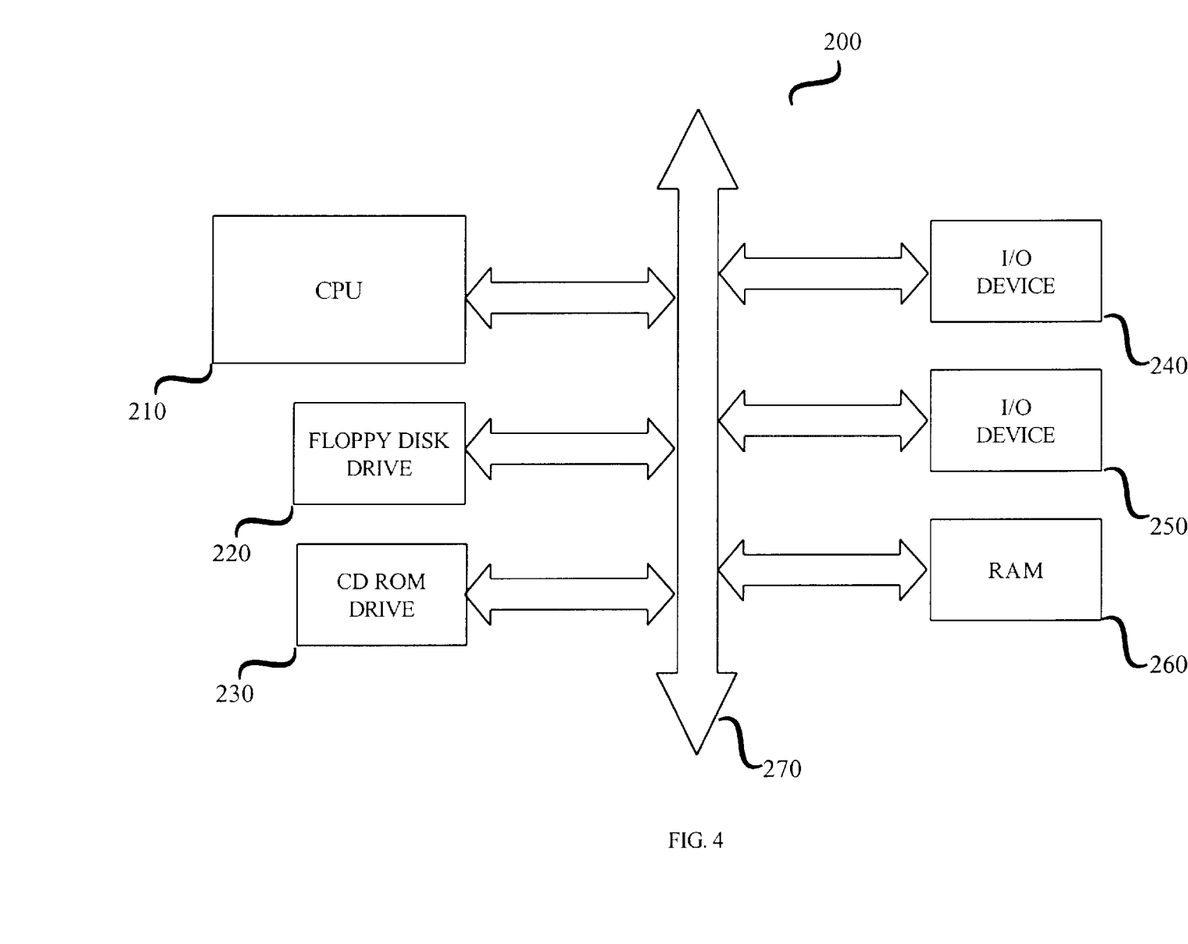
FIG. 4 is a block diagram representation of a processor-based system incorporating the equilibration circuitry in accordance with the invention

A typical processor based system that includes memory circuits having the equilibration circuit according to the present invention is illustrated generally at 200 in FIG. 4. A processor based system, such as a computer system, for example, generally comprises a central processing unit (CPU) 210, for example, a microprocessor, that communicates with one or more input/output (I/O) devices 240, 250 over a bus 270. The CPU 210 also exchanges data with random access memory (RAM) 260 over bus 270, typically through a memory controller. The processor system may also include peripheral devices such as a floppy disk drive 220 and a compact disk (CD) ROM drive 230 which also communicate with CPU 210 over the bus 270. RAM 260 is preferably constructed as an integrated circuit that includes an equilibration circuit as described with respect to FIGS. 2, 3. It may also be desirable to integrate the processor 210 and memory 260 on a single IC chip.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A memory device equilibration method, said method comprising:
    coupling a first pair of digit lines to a sense amplifier while isolating a second pair of digit lines from said sense amplifier and equilibrating said first pair of digit lines;
    isolating said first pair of digit lines from said sense amplifier while coupling said second pair of digit lines to said sense amplifier and equilibrating said second pair of digit lines; and
    isolating said first and second pair of digit lines from said sense amplifier and equilibrating said sense amplifier.
2. The method in claim 1, wherein said wherein said equilibrating voltage is Vcc/2.

3. A method of reading data from a memory device, said method comprising:
  coupling a first pair of digit lines to a sense amplifier while isolating a second pair of digit lines from said sense amplifier and equilibrating said first pair of digit lines;
  isolating said first pair of digit lines from said sense amplifier while coupling said second pair of digit lines to said sense amplifier and equilibrating said second pair of digit lines;
  isolating said first and second pair of digit lines from said sense amplifier and equilibrating said sense amplifier; and
  operating said sense amplifier to sense a memory cell value from one of said first and second pairs of digit lines.

4. The method in claim 3, wherein said wherein said equilibrating voltage is Vcc/2.

5. A method of digit line equilibration, said method comprising:
  isolating a sense amplifier from a first pair digit lines which are affected by shorting conditions, and
  connecting a second pair of digit lines which are unaffected by shorting conditions to said sense amplifier and equilibrating said second pair of digit lines.

6. The method in claim 5, further comprising isolating said first and second pairs of digit lines from said sense amplifier and equilibrating said sense amplifier.

7. The method in claim 6, wherein said wherein said equilibrating voltage is Vcc/2.

8. A method of equilibrating a plurality of digit lines of a memory device, comprising:
  supplying a first signal enabling a first isolation circuit to electrically couple a first pair of digit lines with an equilibration circuit and a sense amplifier;
  supplying a second signal enabling a second isolation circuit to electrically uncouple a second pair of digit lines from said
  equilibration circuit while said first isolation circuit is enabled;
  supplying a third signal enabling said equilibration circuit while said first and second signals are present thereby equilibrating said first pair of digit lines;
  supplying a fourth signal disabling said first isolation circuit;
  supplying a fifth signal enabling said second isolation circuit while said first isolation circuit is disabled and said third signal is present, allowing said second pair of digit lines to be electrically coupled with and equilibrated by said equilibration circuit;
  supplying sixth and seventh signals disabling said first and second isolation circuits while said equilibration circuit remains enabled by said third signal thereby equilibrating said sense amplifier; and
  supplying an eighth signal disabling said equilibration circuit.

9. A method of equilibrating a plurality of digit lines selectively coupled to a sense amplifier, said method comprising:
  providing to said pair of digit lines an equilibrate voltage while said pair of digit lines are isolated from other digit lines;
  thereafter providing said equilibrate voltage to said sense amplifier isolated from any digit lines; and
  thereafter using said sense amplifier to sense a memory cell coupled to one of said digit lines of said pair of digit lines.

10. The method in claim 9, wherein said wherein said equilibrate voltage is about Vcc/2.

11. An memory device, comprising:
  a first and second isolation circuit, each controlled by a respective first and second control signal;
  a first conductive line having one end adapted to being electrically coupled to a first memory cell, and another end adapted to being electrically coupled to one side of said first isolation circuit;
  a second conductive line having one end adapted to being electrically coupled to a second memory cell, and another end adapted to being electrically coupled to one side of said second isolation circuit;
  a sense amplifier electrically coupled to an equilibration circuit, said sense amplifier and said equilibration circuit being arranged between said first and second isolation circuits, said equilibration circuit providing an equilibration voltage in response to a third control signal; and
  a control circuit for providing said first, second, and third control signal in a manner such that said equilibration circuit first supplies said equilibration voltage to said first conductive line and not said second conductive line and then supplies said equilibration voltage to said second conductive line and not said first conductive line, and then supplies said equilibration voltage to said sense amplifier and not to said first or second conductive line.

12. The memory device in claim 11, where an equilibration voltage is Vcc/2 in said equilibration circuit.

13. An memory device, comprising:
  a first and second isolation circuit, each controlled by a respective first and second control signal;
  a first pair of digit lines having one end adapted to being electrically coupled to a first memory cell, and another end adapted to being electrically coupled to one side of said first isolation circuit;
  a second pair of digit lines having one end adapted to being electrically coupled to a second memory cell, and another end adapted to being electrically coupled to one side of said second isolation circuit;
  a sense amplifier electrically coupled to an equilibration circuit, said sense amplifier and said equilibration circuit being arranged between said first and second isolation circuits, said equilibration circuit providing an equilibration voltage in response to a third control signal; and
  a control circuit for providing said first, second, and third control signal in a manner such that said equilibration circuit first supplies said equilibration voltage to said first pair of digit lines and not said second pair of digit lines and then supplies said equilibration voltage to said second pair of digit lines and not said first pair of digit lines, and then supplies said equilibration voltage to said sense amplifier and not to said first or second pair of digit lines.

14. The memory device in claim 13, where an equilibration voltage is Vcc/2 in said equilibration circuit.

15. An memory device, comprising:
  a first isolation circuit being electrically coupled on one side to a first memory array by a first pair of digit lines;
  a second isolation circuit being electrically coupled on one side to a second memory array by a second pair of digit lines;

a sense amplifier on one side adapted to being electrically coupled to other side of one of said first or second isolation circuit;

an equilibration circuit being electrically coupled to other side of said sense amplifier, on other side adapted to being electrically coupled to other side of the other said first or second isolation circuit; and a logic controller for operating said first and second isolation circuits and said equilibration circuit by transmitting a signal:

enabling said equilibration circuit;

enabling said first isolation circuit and disabling said second isolation circuit while said equilibration circuit is enabled to equilibrate said first pair of digit lines;

disabling said first isolation circuit and enabling said second isolation circuit while said equilibration circuit is enabled to equilibrate said second pair of digit lines; and disabling said first isolation circuit and disabling said second isolation circuit while said equilibration circuit is enabled to equilibrate said sense amplifier.

16. The memory device in claim 15, where an equilibration voltage is Vcc/2 in said equilibration circuit.

17. A processor system, comprising:

a processor; and an memory device for exchanging data with said processor, said memory device comprising:
a first and second isolation circuit, each controlled by a respective first and second control signal;
a first conductive line having one end adapted to being electrically coupled to a first memory cell, and another end adapted to being electrically coupled to one side of said first isolation circuit;
a second conductive line having one end adapted to being electrically coupled to a second memory cell, and another end adapted to being electrically coupled to one side of said second isolation circuit;
a sense amplifier electrically coupled to an equilibration circuit, said sense amplifier and said equilibration circuit being arranged between said first and second isolation circuits, said equilibration circuit providing an equilibration voltage in response to a third control signal; and
a control circuit for providing said first, second, and third control signal in a manner such that said equilibration circuit first supplies said equilibration voltage to said first conductive line and not said second conductive line and then supplies said equilibration voltage to said second conductive line and not said first conductive line, and then supplies said equilibration voltage to said sense amplifier and not to said first or second conductive line.

18. The processor system in claim 17, where an equilibration voltage is Vcc/2 in said equilibration circuit.

19. A processor system, comprising:

a processor; and an memory device for exchanging data with said processor, said memory device comprising:
a first and second isolation circuit, each controlled by a respective first and second control signal;
a first pair of digit lines having one end adapted to being electrically coupled to a first memory cell, and another end adapted to being electrically coupled to one side of said first isolation circuit;
a second pair of digit lines having one end adapted to being electrically coupled to a second memory cell, and another end adapted to being electrically coupled to one side of said second isolation circuit;
a sense amplifier electrically coupled to an equilibration circuit, said sense amplifier and said equilibration circuit being arranged between said first and second isolation circuits, said equilibration circuit providing an equilibration voltage in response to a third control signal; and
a control circuit for providing said first, second, and third control signal in a manner such that said equilibration circuit first supplies said equilibration voltage to said first pair of digit lines and not said second pair of digit lines and then supplies said equilibration voltage to said second pair of digit lines and not said first pair of digit lines, and then supplies said equilibration voltage to said sense amplifier and not to said first or second pair of digit lines.

20. The processor system in claim 19, where an equilibration voltage is Vcc/2 in said equilibration circuit.

21. A processor system, comprising:

a processor; and an memory device for exchanging data with said processor, said memory device comprising:
a first isolation circuit being electrically coupled on one side to a first memory array by a first pair of digit lines;
a second isolation circuit being electrically coupled on one side to a second memory array by a second pair of digit lines;
a sense amplifier on one side adapted to being electrically coupled to other side of one of said first or second isolation circuit;
an equilibration circuit being electrically coupled to other side of said sense amplifier, on other side adapted to being electrically coupled to other side of the other said first or second isolation circuit; and
a logic controller for operating said first and second isolation circuits and said equilibration circuit by transmitting a signal:
enabling said equilibration circuit;
enabling said first isolation circuit and disabling said second isolation circuit while said equilibration circuit is enabled to equilibrate said first pair of digit lines;
disabling said first isolation circuit and enabling said second isolation circuit while said equilibration circuit is enabled to equilibrate said second pair of digit lines; and
disabling said first isolation circuit and disabling said second isolation circuit while said equilibration circuit is enabled to equilibrate said sense amplifier.

22. The processor system in claim 21, where an equilibration voltage is Vcc/2 in said equilibration circuit.

* * * * *

UNITED STATES PATENT AND TRADEMARK OFFICE
CERTIFICATE OF CORRECTION

PATENT NO. : 6,590,819 B1
DATED : July 8, 2003
INVENTOR(S) : Aaron M. Baum et al.

It is certified that error appears in the above-identified patent and that said Letters Patent is hereby corrected as shown below:

Column 1,
Line 30, change "charge then the it" to -- charge it --.

Column 6,
Line 66, delete the second occurrence of "wherein said".

Column 8,
Line 4, delete the second occurrence of "wherein said".

Signed and Sealed this

Twenty-first Day of October, 2003

JAMES E. ROGAN
*Director of the United States Patent and Trademark Office*